(12) United States Patent
Lee

(10) Patent No.: US 7,645,697 B2
(45) Date of Patent: Jan. 12, 2010

(54) METHOD FOR FORMING A DUAL INTERLAYER DIELECTRIC LAYER OF A SEMICONDUCTOR DEVICE

(75) Inventor: Tae Young Lee, Seongnam-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 463 days.

(21) Appl. No.: 11/644,890

(22) Filed: Dec. 26, 2006

(65) Prior Publication Data

US 2007/0155162 A1     Jul. 5, 2007

(30) Foreign Application Priority Data

Dec. 29, 2005    (KR)  ........................ 10-2005-0134182

(51) Int. Cl.
*H01L 21/4763*     (2006.01)
(52) U.S. Cl. ................................ 438/637; 257/E23.145
(58) Field of Classification Search ................ 438/637, 438/624; 257/E23.145
See application file for complete search history.

(56) References Cited

U.S. PATENT DOCUMENTS

RE37,865 E    *   10/2002   Dennison ..................... 438/622
6,849,887 B2 *   2/2005   Nagano et al. .............. 257/295

* cited by examiner

*Primary Examiner*—Thao Le
(74) *Attorney, Agent, or Firm*—Andrew C. Sonu

(57) ABSTRACT

A method for forming a dual interlayer dielectric layer, which is capable of preventing an interlayer delamination phenomenon generated between an etch stop layer and an interlayer dielectric layer is provided. An interlayer dielectric layer of a dual structure is formed such that a first interlayer dielectric layer and a second interlayer dielectric layer are sequentially stacked on the etch stop layer. The etch stop layer is formed on a substrate, the substrate having a source/drain region and a gate formed therein. The dual interlayer dielectric layer is selectively etched, and a conductive material is deposited thereon, thereby forming a contact. The $O_3$-TEOS layer and the PE-TEOS layer used as the first interlayer dielectric layer can relieve a compressive stress and improve adhesion force, respectively, thereby preventing the interlayer delamination phenomenon.

4 Claims, 3 Drawing Sheets

METHOD FOR FORMING A DUAL INTERLAYER DIELECTRIC LAYER OF A SEMICONDUCTOR DEVICE

RELATED APPLICATION

This application is based upon and claims the benefit of priority to Korean Application No. 10-2005-0134182 filed on Dec. 29, 2005, the entire contents of which are incorporated herein by reference.

BACKGROUND

1. Technical Field

The present invention relates to a method for manufacturing a semiconductor device. More specifically, the present invention relates to a method for forming a dual interlayer dielectric layer capable of preventing an interlayer delamination phenomenon generated between an etch stop layer and an interlayer dielectric layer.

2. Description of the Related Art

As the current trend in semiconductor devices change toward high integration and smaller sizes, a borderless contact (BLC) technique has been suggested in order to assure a margin capable of compensating for a misalignment in a contact process. Such a technique refers to a method in which a contact is self-aligned by means of a sidewall spacer of a gate when the contact is formed inside the interlayer dielectric layer (ILD) so as to connect with a source/drain region of a silicon substrate. Thus, the borderless contact technique is referred to as a self-aligned contact (SAC) method.

However, such a contact may partially overlap an isolation layer due to mask misalignment. Therefore, the borderless contact technique typically requires an etch stop layer in order to protect an isolation layer in an anisotropic plasma etching process forming a contact hole. This is because the isolation layer may be physically damaged by the contact hole etching process which causes a leakage current, thereby deteriorating the qualities of the semiconductor device.

FIG. 1 is a cross-sectional view showing a structure of an interlayer dielectric layer of a semiconductor device according to the related art.

As shown in FIG. 1, a gate insulating layer 12 and a gate 13 are formed on a silicon substrate 10 including an isolation layer 11. A sidewall spacer 14 is formed on both sidewalls of gate 13, respectively, and a source/drain region 15 is formed in silicon substrate 10. A silicide (not shown) is formed on source/drain region 15 and gate 13, respectively. Etch stop layer 16 is formed in such a manner as to cover the entire structure, and an interlayer dielectric layer 17 is sequentially formed on etch stop layer 16. A contact hole is formed by etching interlayer dielectric layer 17, and then a conductive material (e.g., tungsten) is deposited in the contact hole, thereby forming a contact 18.

In such a conventional structure, etch stop layer 16 is made of silicon nitride, and interlayer dielectric layer 17 includes an oxide layer formed using high-density plasma chemical vapor deposition (hereinafter, refers to as a "HDP-CVD") having superior gap fill capacity. However, an interlayer delamination phenomenon is frequently generated since the adhesion force between etch stop layer 16 and interlayer dielectric layer 17 is weak. Further, compressive stress of etch stop layer 16 and interlayer dielectric layer 17 stacked on etch stop layer 16 accumulates, causing the interlayer delamination phenomenon. When such interlayer delamination phenomenon is generated, the contact material penetrates into the etched region during the subsequent process, i.e., a contact material deposition process, causing an electric short and deteriorating the product yield of the semiconductor device.

BRIEF SUMMARY

To solve the above-mentioned problems occurring in the prior art, there is provided consistent with the present invention an interlayer dielectric layer structure and a method for forming the same, which is capable of improving an adhering capacity between an etch stop layer and an interlayer dielectric layer, as well as attenuating stress therebetween.

Consistent with the present invention there is also provided an interlayer dielectric layer structure and a method for forming the same, which is capable of preventing an interlayer delamination phenomenon generated between an etch stop layer and an interlayer dielectric layer during a contact material deposition process.

Consistent with the present invention, there is further provided a method for forming a dual interlayer dielectric layer of a semiconductor device having a structure, which will be described below.

A method for forming a dual interlayer dielectric layer consistent with the present invention comprises: forming an etch stop layer on a substrate, the substrate having a source/drain region and a gate formed therein; depositing a first interlayer dielectric layer including $O_3$-TEOS on the etch stop layer; flattening the first interlayer dielectric layer; depositing a second interlayer dielectric layer including PE-TEOS on the first interlayer dielectric layer; and forming a contact by selectively etching the first interlayer dielectric layer and the second interlayer dielectric layer and depositing a conductive material thereon.

Further, another method for forming a dual interlayer dielectric layer consistent with the present invention comprises: forming an etch stop layer on a substrate, the substrate having a source/drain region and a gate formed therein; depositing a first interlayer dielectric layer formed of PE-TEOS on the etch stop layer; depositing a second interlayer dielectric layer formed of HDP-CVD on the first interlayer dielectric layer; and forming a contact by selectively etching the first interlayer dielectric layer and the second interlayer dielectric layer and depositing a conductive material thereon.

In a method for forming the dual interlayer dielectric layer consistent with the present invention, the etch stop layer may be made of a silicon nitride. Further, the first interlayer dielectric layer and the second interlayer dielectric layer have preferable deposition conditions, respectively.

Meanwhile, consistent with the present invention there is also provided a dual interlayer dielectric layer of the semiconductor device formed by the method as described above.

DETAILED DESCRIPTION

Hereinafter, a preferred embodiment consistent with the present invention will be described in detail, with reference to the following drawings.

Description of techniques, which have been widely known in the related technical field and not directly related with the present invention, are omitted to make essential points of the present invention clear by omitting unnecessary description. In the same reason, some components are exaggerated, omitted or schematically drawn in the attached drawings, and a size of each component does not utterly reflect an actual size.

Figure 1:
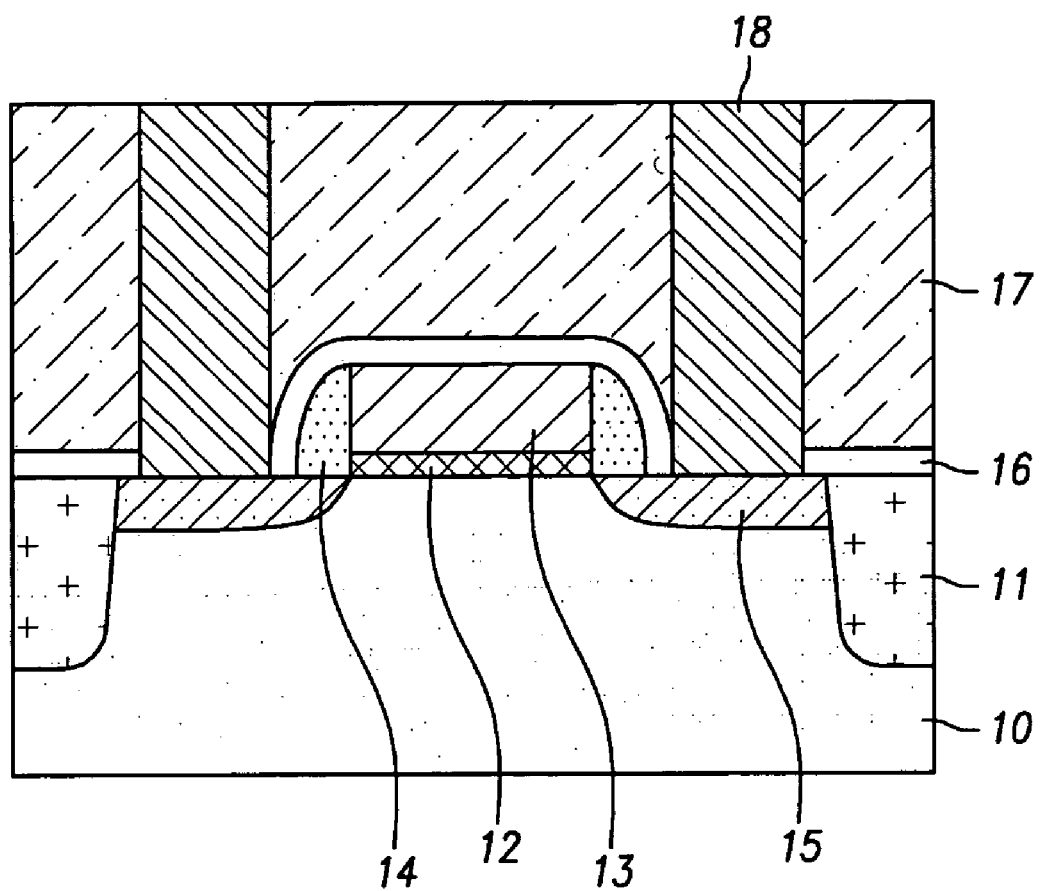
FIG. 1 is a cross-sectional view showing a structure of an interlayer dielectric layer of a semiconductor device according to the conventional invention.
Figure 2:
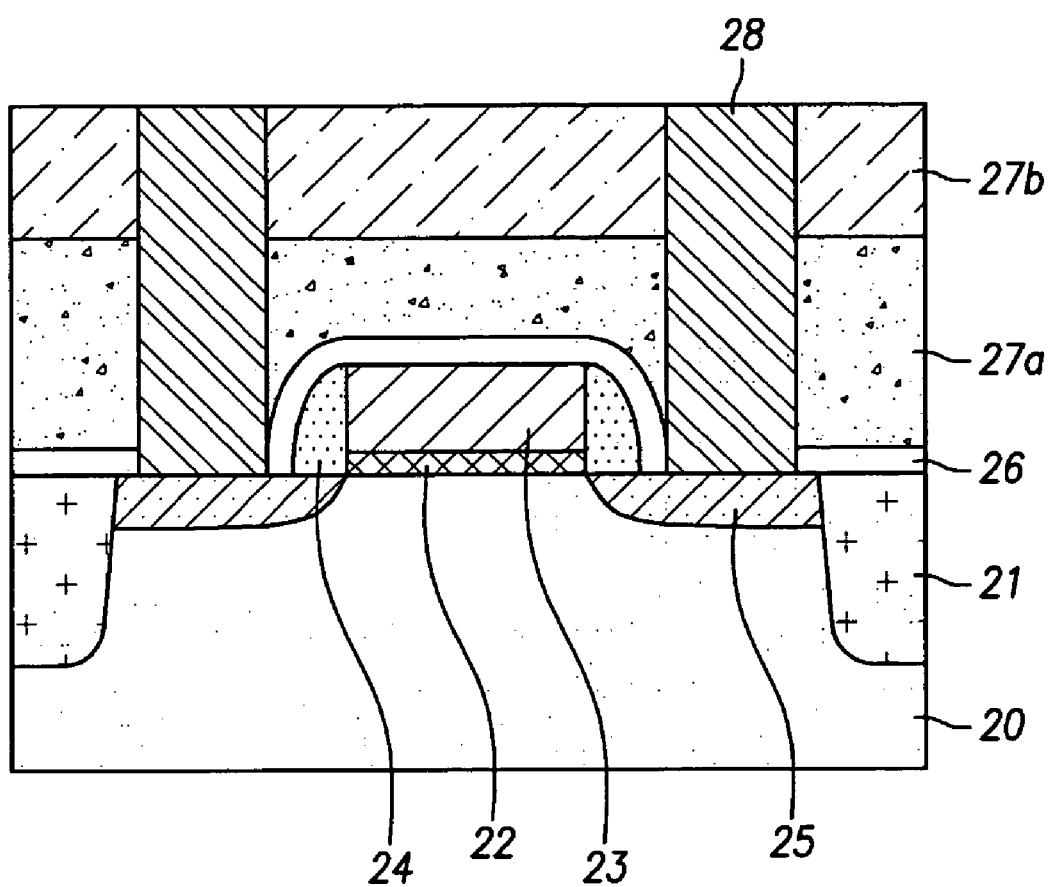
FIG. 2 is a cross-sectional view showing a structure of a dual interlayer dielectric layer of a semiconductor device according to a preferred embodiment consistent with the present invention.

FIG. 2 is a cross-sectional view showing a structure of a dual interlayer dielectric layer of a semiconductor device according to a preferred embodiment consistent with the present invention.

Referring to FIG. 2, an isolation layer 21 such as STI (shallow trench isolation) is formed on a silicon substrate 20, thereby defining an active region. A gate oxide layer 22 and a gate 23 are formed on silicon substrate 20, and a sidewall spacer 24 is formed on the both sidewalls of gate 23. A source/drain region 25 is formed in the active region of silicon substrate 20, and a silicide (not shown) is formed on source/drain region 25 and gate 23, respectively.

Etch stop layer 26 is formed in such a manner as to cover the entire structure, and interlayer dielectric layers 27a and 27b of a dual layer structure are sequentially stacked on etch stop layer 26. A contact hole is formed by selectively etching interlayer dielectric layers 27a and 27b, and a contact is formed by depositing a conductive material (e.g., tungsten) into the contact hole.

In such a structure, etch stop layer 26 is made of silicon nitride in the same manner as the conventional invention. Further, interlayer dielectric layers 27a and 27b may include ozone Tetraethoxysilane (hereinafter, referred to as $O_3$-TEOS layer) and plasma-enhanced Tetraethoxysilane (hereinafter, refers to as PE-TEOS layer), respectively.

$O_3$-TEOS layer 27a directly abuts against etch stop 26 and has an excellent gap fill capacity and functions to relieve compressive stress.

Interlayer dielectric layers 27a and 27b according to a preferred embodiment consistent with the invention may be formed by a method and which will be described below.

$O_3$-TEOS layer 27a is deposited on a structure including etch stop layer 26 deposited therein. The deposition condition of the $O_3$-TEOS layer is as follows:

TEOS: 1000 mgm±10%; $O_3$: 4500 sccm±10%; $N_2$: 4000 sccm; He: 2000 sccm; temperature: 480° C.; and pressure: 500 Torr.

$O_3$-TEOS layer (27a) is then flattened using a chemical mechanical polishing (CMP) process, and then PE-TEOS layer 27b is deposited on $O_3$-TEOS layer 27a. The deposition condition of PE-TEOS layer 27b is as follows:

TEOS: 950±100 mgm; $O_2$: 840±50 sccm; He: 560±50 sccm; temperature: 400° C.; pressure: 5 Torr; HF electric power: 550±25 W; and LF electric power: 125±10 W.

Figure 3:
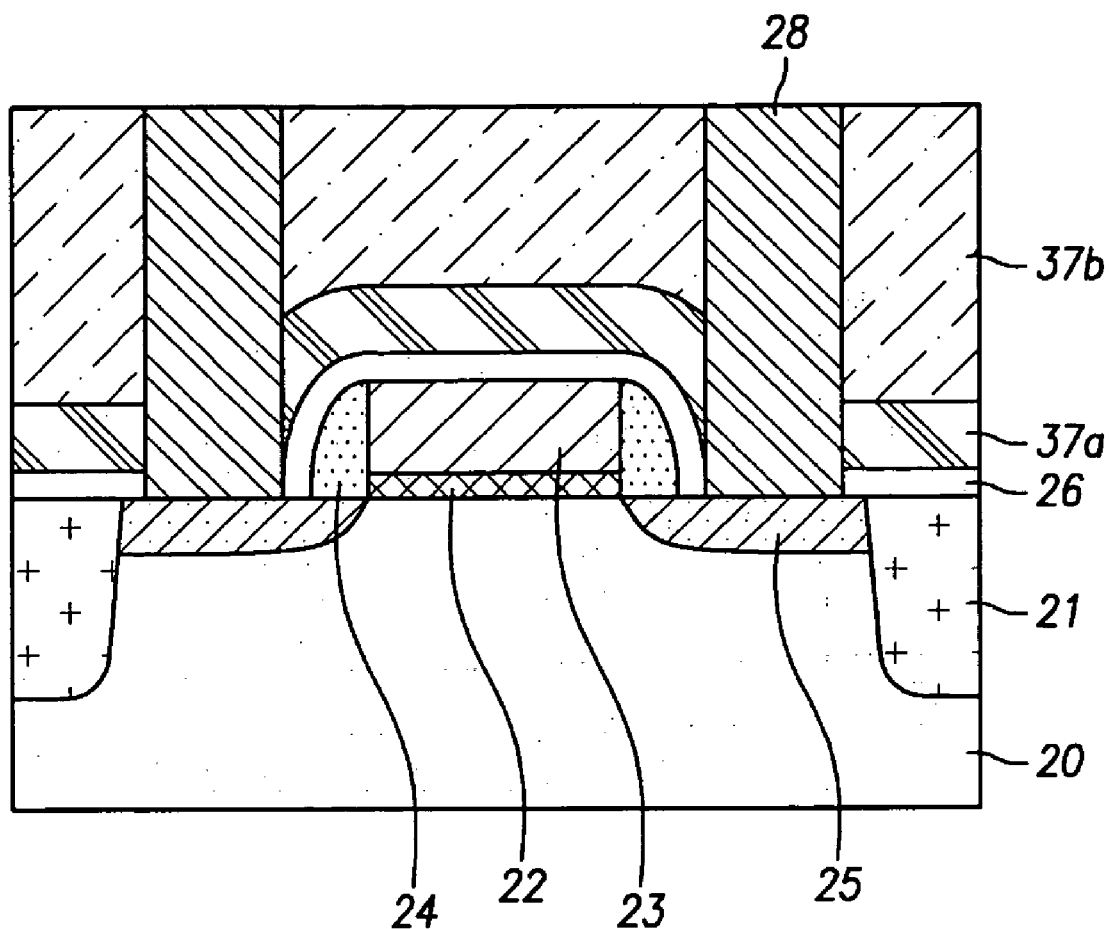
FIG. 3 is a cross-sectional view showing a structure of a dual interlayer dielectric layer of a semiconductor device according to another preferred embodiment consistent with the present invention.

The dual interlayer dielectric layer consistent with the present invention may have another structure. FIG. 3 is a cross-sectional view showing a structure of a dual interlayer dielectric layer of a semiconductor device according to another preferred embodiment consistent with the present invention.

Referring to FIG. 3, the other components except for the interlayer dielectric layer are identical to that of the preferred embodiment as described above. Accordingly, the description of the same reference numerals will be omitted since they are used to denote identical elements having the same functions throughout the drawings. Interlayer dielectric layers 37a and 37b of a dual layer structure, which are sequentially formed on etch stop layer 26, include a PE-TEOS layer 37a and a HDP-CVD layer 37b, respectively.

When PE-TEOS layer 37a is shallowly deposited on etch stop layer 26 before depositing HDP-CVD layer 37b, PE-TEOS layer 37a can prevent a delamination phenomenon generated between etch stop layer 26 and HDP-CVD layer 37b while acting as an adhesion layer.

Interlayer dielectric layers 37a and 37b according to a preferred embodiment consistent with the invention may be formed by a method and which will be described below.

PE-TEOS layer 37a is deposited on a structure including etch stop layer 26. A deposition condition of the PE-TEOS layer is identical to that of PE-TEOS layer (27b) according to a preferred embodiment consistent with the invention as described above. However, only the time of the deposition is adjusted in order to obtain thin deposition thickness.

HDP-CVD layer 37b is deposited on deposited PE-TEOS layer 37a. The deposition condition of HDP-CVD layer 37b is as follows:

Ar: 110 sccm±10% (side), 16 sccm±10% (top); $O_2$: 100~140 sccm (side), 15~20 sccm (top); $SiH_4$: 45~65 sccm (side), 8~11 sccm (top); Pressure: throttle valve is fully opened; RF electrical power: 1300 W±10% (top), 3100 W±10% (side), 2400~3100 W (bias).

As described above, according to a structure of a dual interlayer dielectric layer and a method for forming the same consistent with the present invention, the $O_3$-TEOS layer having an excellent gap fill capacity and adapted for relieving compressive stress is formed on the etch stop layer, so that an interlayer delamination phenomenon can be prevented from being generated between the etch stop layer and the interlayer dielectric layer, and the contact material may be prevented from penetrating in the following contact material deposition process.

Further, according to a structure of a dual interlayer dielectric layer and a method for forming the same consistent with the present invention, the thin PE-TEOS layer functioning as an adhesion layer is formed on the etch stop layer, so that an adhering force between the etch stop layer and the interlayer dielectric layer can be improved, thereby preventing the interlayer delamination phenomenon generated between the etch stop layer and the interlayer dielectric layer.

It will be apparent to those skilled in the art that various changes and modifications may be made without departing from the spirit and scope consistent with the invention and the following claims.

What is claimed is:

1. A method for forming a dual interlayer dielectric layer of a semiconductor device comprising:
    forming an etch stop layer on a substrate, the substrate having a source/drain region and a gate formed thereon;
    depositing a first interlayer dielectric layer including $O_3$-TEOS on the etch stop layer;
    planarizing the first interlayer dielectric layer;
    depositing a second interlayer dielectric layer including PE-TEOS on the first interlayer dielectric layer; and
    forming a contact by selectively etching the first interlayer dielectric layer and the second interlayer dielectric layer and depositing a conductive material thereon.

2. The method according to claim 1, wherein the etch stop layer includes silicon nitride.

3. The method according to claim 1, wherein depositing the first interlayer dielectric layer comprises performing a deposition process under conditions including: TEOS: 1000 mgm±10%; $O_3$: 4500 sccm±10%; $N_2$: 4000 sccm; He: 2000 sccm; temperature: 480° C.; and pressure: 500 Torr.

4. The method according to claim 1, wherein depositing the second interlayer dielectric layer comprises performing a deposition process under conditions including: TEOS: 950±100 mgm; $O_2$: 840±50 sccm; He: 560±50 sccm; temperature: 400° C.; pressure: 5 Torr; HF electric power: 550±25 W; and LF electric power: 125±10 W.

* * * * *

UNITED STATES PATENT AND TRADEMARK OFFICE
CERTIFICATE OF CORRECTION

| | | |
|---|---|---|
| PATENT NO. | : 7,645,697 B2 | Page 1 of 1 |
| APPLICATION NO. | : 11/644890 | |
| DATED | : January 12, 2010 | |
| INVENTOR(S) | : Tae Young Lee | |

It is certified that error appears in the above-identified patent and that said Letters Patent is hereby corrected as shown below:

Title page, item (74), "Attorney, Agent, or Firm-Andrew C. Sonu" should read

--Attorney, Agent, or Firm-Finnegan, Henderson, Farabow, Garrett & Dunner, L.L.P.--.

Signed and Sealed this
Fourth Day of January, 2011

David J. Kappos
*Director of the United States Patent and Trademark Office*